Nov. 24, 1964 L. J. YOUNG 3,158,503

METALLIZING HOLES

Filed May 11, 1962

INVENTOR

LAWRENCE J. YOUNG

By Watson, Cole, Grindle & Watson

ATTORNEYS

3,158,503
METALLIZING HOLES

Lawrence John Young, Woodbridge, Suffolk, England, assignor to Young Research Laboratories Limited, London, England, a British company

Filed May 11, 1962, Ser. No. 193,985
8 Claims. (Cl. 117—212)

The invention relates to methods of metallizing holes for example the holes of printed circuit boards.

According to the present invention, there is provided a method of producing a metallized hole in a board, such as a printed circuit board, which method comprises aligning a hole of a first board with a hole which is to be metallized of a second board, introducing into the hole of the first board a flexible metallic paste, and thereafter transferring the paste from the hole of the first board to coat at least a substantial proportion of the wall of the hole of the second board.

Preferably, the first and second boards are spaced apart by a small amount sufficient to allow a thin coating of the paste to overlie that face of the second board which is closest to the first board. The spacing apart of the two boards may be effected as a result of the face of the second board having imparted thereto a printed circuit.

It is preferred that the metallic paste contains as metallic ingredients, silver particles or silver coated copper particles. Alternatively, the metallic ingredient may be in flake form. Flexible metallic paste may comprise finely-divided metallic particles suspended or dispersed in a thickened organic solvent. The flexible metallic pastes preferably has a consistency such as those pastes used for metallizing glass or ceramics. A metallic paste comprising particles of finely-divided metal and organic constituents is cured at an elevated temperature to drive off at least a substantial proportion of the organic materials and leave the metal in a suitable condition for soldering purposes. For example, the paste may be heated at a temperature of from 80° to 120° C., and is preferably heated at a temperature of from 90° to 110° for from 30 mins. to one hour.

Preferably the transferring of the metallic paste from the first board to the second board, is carried out by application of air pressure.

When the metallic paste contains powdered metal it is preferred that the powder is in a very fine state, i.e. it will pass a 200 B.S. sieve; it is more preferred that the powder passes a 500 B.S. sieve.

Figure 1:
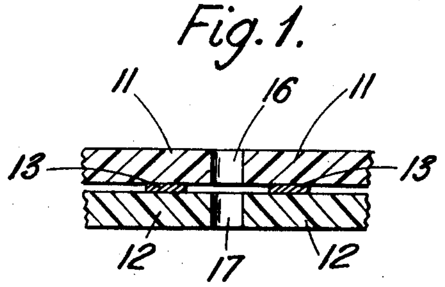
Figure 2:
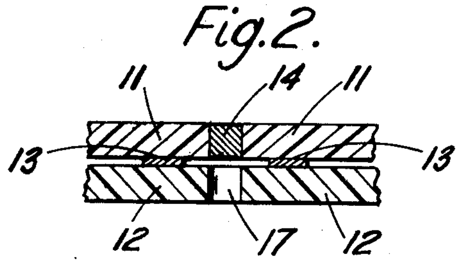
Figure 3:
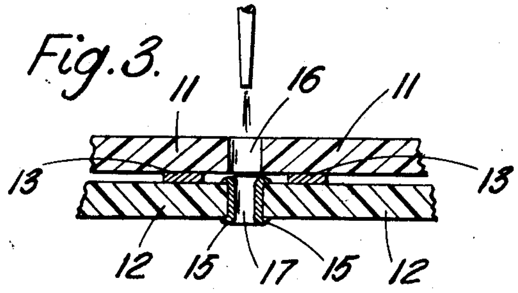

Following is a description by way of example of one method of carrying the present invention into effect. The method is illustrated in the accompanying drawings in which FIGURES 1, 2 and 3 are sectional views through two boards showing various stages of metallizing a hole.

In this example, the method is illustrated with a printed circuit board on which a circuit has been formed. One method of producing a printed circuit comprises applying to the surface of a board of electrical insulating material, such as a phenolic laminated board, a layer of a cold-pressing adhesive corresponding at least to the desired circuit pattern, applying to the surface of the base a layer of finely-divided metal, applying pressure corresponding to the circuit pattern in order to compact the metal and to consolidate it with the adhesive and base, removing any uncompacted metal and thereafter heating the printed circuit for example at a temperature of 100° C., to set the adhesive.

After the curing of the adhesive, the holes which are to be metallized are hot-punched in the board; the number of holes punched will vary depending on the desired circuit arrangement. As shown in FIGURE 1, the board 11 having the hole 16 of ⅛" diameter punched therein, is positioned over board 12 which carries printed circuit elements

13 so that the holes 16 and 17 in the first and second board respectively are in alignment. The printed circuit element, which may be for example 0.0015" thick, ensures that the first and second boards are spaced apart by a small amount sufficient to allow a thin coating of the paste to overlie that face of the second board which is closest to the first board.

A flowable metal paste in the form of a thick "cream," containing silver powder was then wiped across the upper surface of board 11 with a rubber wiper, thus filling the holes in the upper board with the metallic paste. FIGURE 2 shows the hole 16 of board 11 filled with silver paste 14. An excess of paste is initially applied to the upper surface of board 11 and the paste not required to fill the holes is wiped off and used again.

The silver paste in the holes of the upper board is transferred by use of a jet or jets of compressed air (e.g. air at a pressure of 4 to 5 lbs. per sq. inch), the jet or jets is passed over the upper surface of board 11 and the flexible metallic paste is forced through the holes of the upper board into the holes of the lower board. FIGURE 3 shows the silver paste 15 disposed around the inner surface of the hole 17 and also overlies the upper and lower surface of the board 12 over that part of the surface which is immediately adjacent to the hole. As the two boards 11 and 12 are spaced apart by the small distance owing to the presence of circuit elements 13, the silver paste is able to overlie some of the upper surface of the board 12. An excess of the silver paste passes through the hole which is metallized and can be collected in a tray beneath the second board for re-use.

An example of a silver paste is as follows:

| | | |
|---|---|---|
| Finely divided silver powder passing a 500 B.S. sieve | g | 41.0 |
| Turpinella | cc | 16 |
| Dimethyl phthalate | cc | 2 |
| Ethyl cellulose | g | 1.2 |
| Rosin | g | 0.3 |

A suitable silver paste having the silver powder dispersed in a substantially organic medium is obtained by thorough mixing of the above-mentioned ingredients.

To smooth out the silver paste in the holes of the lower board, the board is preferably clamped to a vibrating arm and vibrated for a few seconds. This assists in providing a desirably even coating of the silver paste.

To cure or harden the paste, the board 12 is then heated at a temperature of about 120° C. for 30 minutes, when the major portion of the organic material in the paste is driven off and the silver is in the form of a hard coating to which circuit components such as condensers or resistors may readily be soldered.

The holes in printed circuits which may be metallized by the method according to this invention, can vary in size over a wide range, for example, holes may be metallized having diameters from 1/32" or 1/16" up to ¼".

If desired a third board may be used to assist the deposition of paste around the edge of the hole furthest from the first board and this third board is to be placed close to or touching the second board.

I claim:

1. A method of producing a metallized hole through a board, such as a printed circuit board, which method comprises aligning a hole of a first board with the hole which is to be metallized of a second board, introducing into the hole of the first board a flexible metallic paste and thereafter transferring the paste from the hole of the first board by directing a jet of a gaseous medium under pressure to the hole of the first board to blow the metallic paste out from said hole of the first board to pass into the hole of the second board thereby coating at least a substantial portion of the wall of the hole of the second board.

2. A method as claimed in claim 1 wherein the first and second boards are spaced apart by a small amount sufficient to allow a thin coating of the paste to overlie that face of the second board which is closest to the first board.

3. A method as claimed in claim 1 wherein the metallic paste contains as metallic ingredient finely divided particles selected from the group consisting of silver and silver coated copper particles.

4. A method as claimed in claim 1 wherein the flexible metallic paste comprises finely divided metallic particles dispersed in a thickened organic solvent.

5. A method as claimed in claim 1 wherein the flexible metallic paste comprises particles of finely divided metal and a thickened organic solvent and the paste coating on said second board is heated at a temperature of from 80° to 120° C. to drive off a substantial proportion of the volatile organic materials.

6. A method as claimed in claim 5 wherein the metallic paste is heated at a temperature of from 90° to 110° C. for from 30 minutes to one hour.

7. A method as claimed in claim 1 wherein the flexible metallic paste is a paste consisting essentially of:

| | |
|---|---|
| Finely divided silver powder passing a 500 B.S. sieve ____ g__ | 41.0 |
| Spirit of turpentine ____ cc__ | 16 |
| Dimethyl phthalate ____ cc__ | 2 |
| Ethyl cellulose ____ g__ | 1.2 |
| Rosin ____ g__ | 0.3 |

8. A method is claimed in claim 1 wherein the gaseous medium is air.

References Cited in the file of this patent

UNITED STATES PATENTS

| | | |
|---|---|---|
| 2,345,227 | White et al. | Mar. 28, 1944 |
| 2,848,359 | Talmey | Aug. 19, 1958 |

FOREIGN PATENTS

| | | |
|---|---|---|
| 854,881 | Great Britain | Nov. 23, 1960 |
| 222,719 | Austria | Aug. 10, 1962 |

OTHER REFERENCES

Printed Circuit Techniques, U.S. Dept. of Commerce, National Bureau of Standards Circular 468, Nov. 15, 1947, pp. 5–13.